United States Patent
Wu et al.

(10) Patent No.: US 9,735,274 B2
(45) Date of Patent: Aug. 15, 2017

(54) SEMICONDUCTOR DEVICE INCLUDING A STACKED WIRE STRUCTURE

(71) Applicant: Taiwan Semiconductor Manufacturing Co., Ltd., Hsinchu (TW)

(72) Inventors: Cheng-Hsien Wu, Hsinchu (TW); Chih-Chieh Yeh, Taipei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/947,650

(22) Filed: Nov. 20, 2015

(65) Prior Publication Data
US 2017/0148907 A1    May 25, 2017

(51) Int. Cl.
*H01L 29/78* (2006.01)
*H01L 29/66* (2006.01)
*H01L 21/768* (2006.01)
*H01L 29/04* (2006.01)

(52) U.S. Cl.
CPC ...... *H01L 29/785* (2013.01); *H01L 21/76877* (2013.01); *H01L 29/045* (2013.01); *H01L 29/6656* (2013.01); *H01L 29/6681* (2013.01); *H01L 29/66484* (2013.01); *H01L 29/66795* (2013.01)

(58) Field of Classification Search
CPC ..................................................... H01L 29/785
USPC ................................................ 257/368, 407
See application file for complete search history.

(56) References Cited

U.S. PATENT DOCUMENTS

| 2013/0161756 A1* | 6/2013 | Glass ............... H01L 29/66545 257/369 |
| 2014/0008700 A1* | 1/2014 | Rachmady ........ H01L 29/66431 257/192 |
| 2014/0197377 A1* | 7/2014 | Kim ...................... H01L 27/092 257/29 |
| 2014/0252489 A1* | 9/2014 | Yu ..................... H01L 29/66795 257/368 |
| 2014/0264634 A1* | 9/2014 | Lee ..................... H01L 29/7854 257/407 |
| 2014/0285980 A1* | 9/2014 | Cappellani .............. H01L 21/76 361/748 |
| 2014/0312427 A1* | 10/2014 | Maeda ................ H01L 27/0924 257/369 |
| 2015/0340490 A1* | 11/2015 | An ......................... H01L 29/785 257/401 |
| 2016/0013186 A1* | 1/2016 | Bae ..................... H01L 27/0886 257/401 |
| 2016/0293774 A1* | 10/2016 | Then ..................... H01L 29/772 |

* cited by examiner

Primary Examiner — Dung Le
(74) Attorney, Agent, or Firm — Sterne, Kessler, Goldstein & Fox P.L.L.C.

(57) ABSTRACT

A semiconductor device structure is provided. The semiconductor device structure includes a substrate and a stacked wire structure formed over the substrate. The semiconductor device structure also includes a gate structure formed over a middle portion of the stacked wire structure and a source/drain (S/D) structure formed at two opposite sides of the stacked wire structure. The S/D structure includes a top surface, a sidewall surface, and a rounded corner between the top surface and the sidewall surface.

18 Claims, 18 Drawing Sheets

US 9,735,274 B2

SEMICONDUCTOR DEVICE INCLUDING A STACKED WIRE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
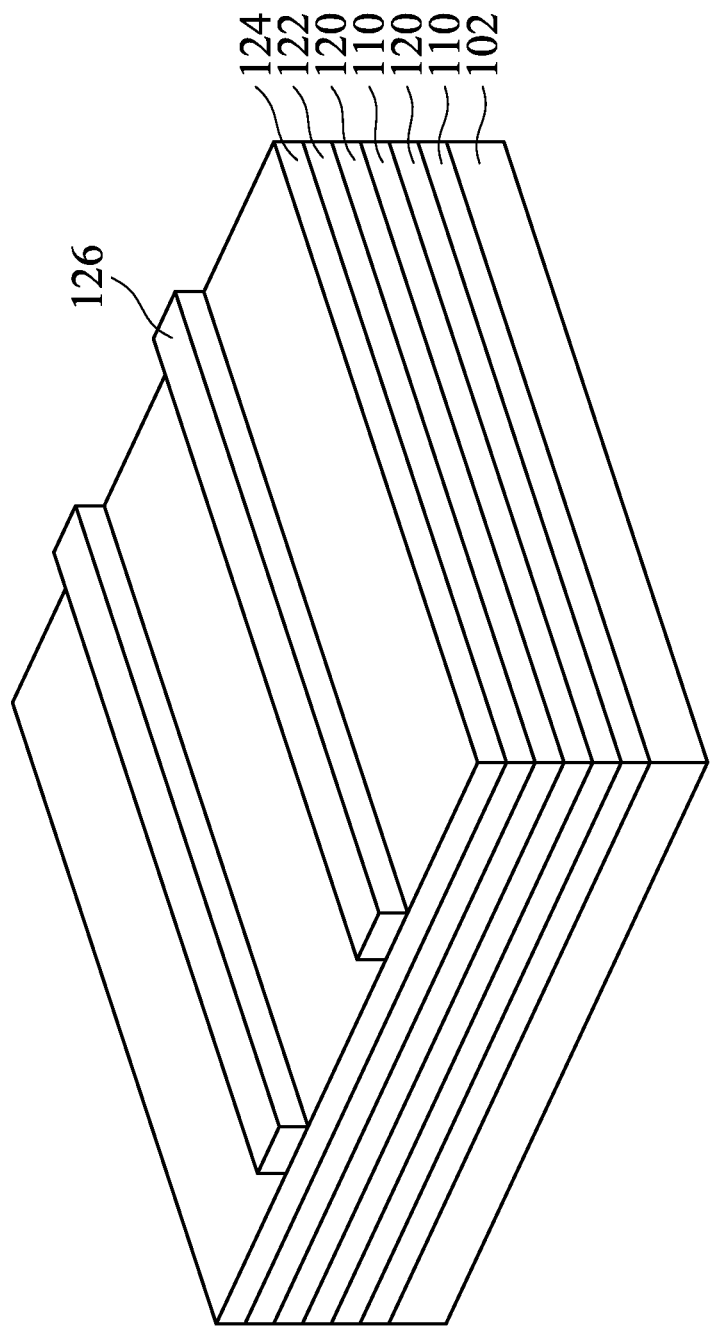
FIGS. 1A-1L show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device structure are provided. FIGS. 1A-1L show perspective representations of various stages of forming a semiconductor device structure, in accordance with some embodiments of the disclosure.

Referring to FIG. 1A, a substrate 102 is provided. The substrate 102 has a first region 11 and a second region 12. In some embodiments, a n-type Metal Oxide Semiconductor (NMOS) transistor is formed in the first region 11, and a p-type Metal Oxide Semiconductor (NMOS) transistor is formed in the second region 12. In some embodiments, the substrate 102 has (110) surface orientation or (111) surface orientation. These surface orientations are used to control the orientation of the layers which are formed above the substrate 102. In other words, the arrangement of some layers which are above the substrate 102 may be influenced by the surface orientations of the substrate 102. For example, the (110) or (111) surface orientations of the substrate 102 is used to assist in formation of rectangular-like shape source/drain (S/D) structure. A more detailed description will be described later.

The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A first semiconductor layer 110 and a second semiconductor layer 120 are sequentially formed over the substrate 102. The semiconductor layers 110 and 120 are vertically stacked to form a stacked structure. In some embodiments, another first semiconductor layer 110 and another second semiconductor layer 120 are formed over the pair of semiconductor layers 110 and 120. The semiconductor layers 110 and 120 are arranged in alternating pattern.

In some embodiments, the semiconductor layers 110 and 120 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 110 and the second semiconductor layer 120 are made of different materials. In some embodiments, the first semiconductor layer 110 is made of silicon germanium ($Si_{1-x}Ge_x$, $0.1<x<0.7$), and the second semiconductor layer 120 is made of silicon (Si). In some other embodiments, the first semiconductor layer 110 is made of silicon germanium ($Si_{1-x}Ge_x$, $0.1<x<0.7$), and the second semiconductor layer 120 is made of germanium (Ge).

In some embodiments, the semiconductor layers 110 and 120 are formed by a selective epitaxial growth (SEG) process, a chemical vapor deposition (CVD) process (e.g. low-pressure CVD (LPCVD), plasma enhanced CVD (PECVD)), a molecular epitaxy process, another applicable process. In some embodiments, the semiconductor layers 110 and 120 are formed in-situ in the same chamber. It should be noted that the orientation of the semiconductor layers 110 and 120 are decided according to the orientation of the substrate 102.

Next, a dielectric layer 122 and a hard mask layer 124 are formed over the stacked semiconductor layers 110 and 120. A photoresist layer 126 is formed over the mask layer, as shown in FIG. 1A, in accordance with some embodiments.

The dielectric layer 122 may be used as an adhesion layer between the second semiconductor layer 120 and the hard mask layer 124. In addition, the dielectric layer 122 also be used as an etch stop layer. In some embodiments, the dielectric layer 122 is made of silicon oxide. In some embodiments, the dielectric layer 122 is formed by a thermal oxidation process.

In some embodiments, the hard mask layer 124 is made of silicon nitride. In some embodiments, the hard mask layer 124 is formed by a deposition process, such as low-pressure CVD (LPCVD), plasma enhanced CVD (PECVD), or another deposition process. In some other embodiments, more than one hard mask layer 124 is formed over the dielectric layer 104.

Figure 1B:
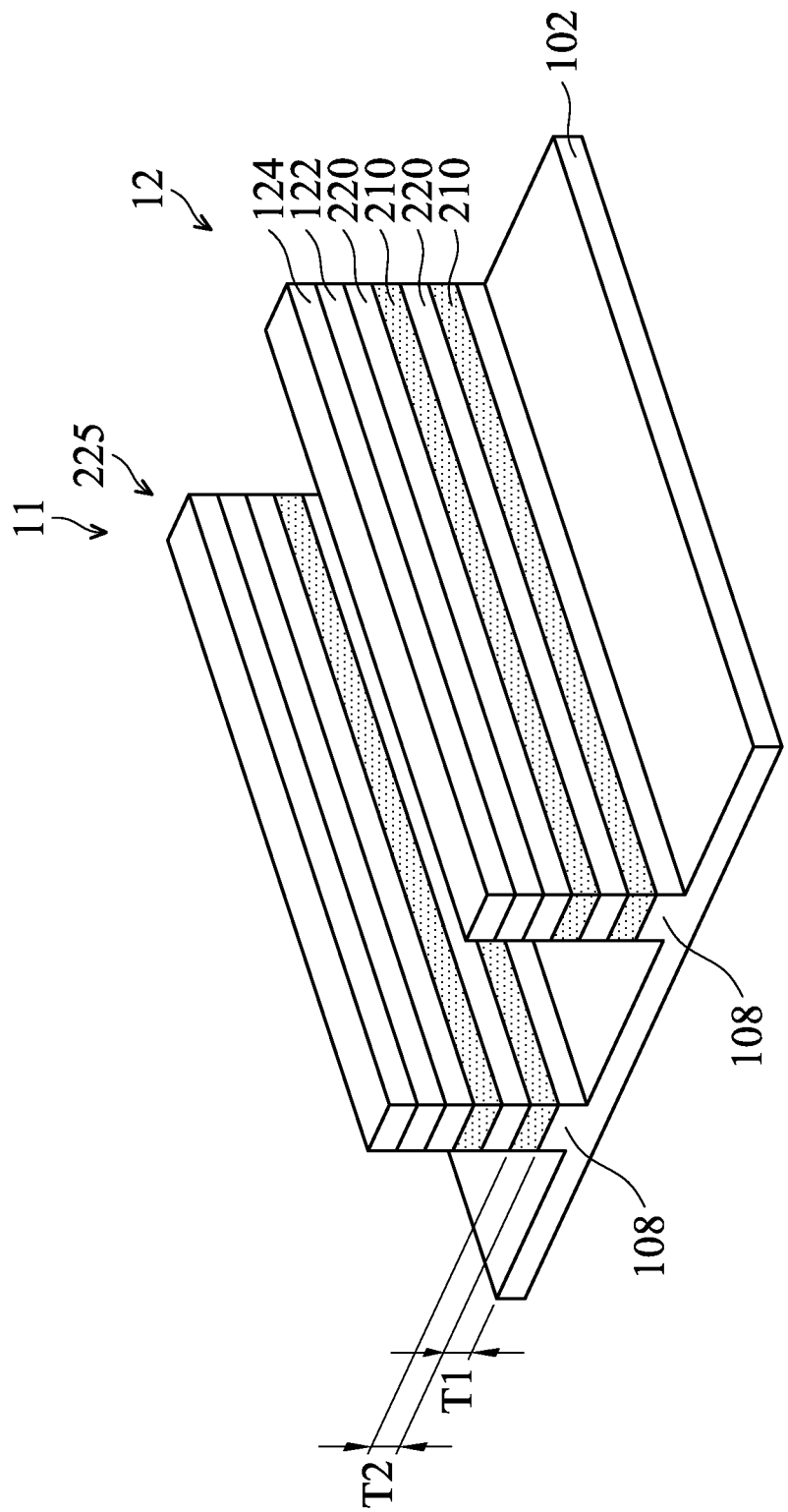

Afterwards, the hard mask layer 124, the dielectric layer 122, the second semiconductor layers 120 and the first semiconductor layers 110 are sequentially patterned by using the photoresist layer 126 as a mask, as shown in FIG. 1B, in accordance with some embodiments.

The hard mask layer 124, the dielectric layer 122, and the semiconductor layers 110 and 120 are patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process. Afterwards, the photoresist layer 126 is removed.

After the etching process, a fin structure 108 is formed over the substrate 102. A first wire structure 210 and a second wire structure 220 are formed over the fin structure 108. Another first wire structure 210 and another second wire structure 220 are formed over the second wire structure 220. The first wire structures 210 and second wire structures 220 are arranged in alternating pattern. As a result, a stacked wire structure 225 is obtained by forming two first wire structures 210 and two second wire structures 220.

In some embodiments, the first wire structure 210 has a first thickness $T_1$, the second wire structure 220 has a second thickness $T_2$, and the first thickness $T_1$ is equal to the second thickness $T_2$. In some other embodiments, the first thickness $T_1$ is not equal to the second thickness $T_2$.

Afterwards, an insulating layer (not shown) is formed over the stacked wire structure 225, and the substrate 102. In some embodiments, the insulating layer is made of silicon oxide, silicon nitride, silicon oxynitride, fluoride-doped silicate glass (FSG), or another low-k dielectric material. The insulating layer may be deposited by a chemical vapor deposition (CVD) process, a spin-on-glass process, or another applicable process.

Figure 1C:
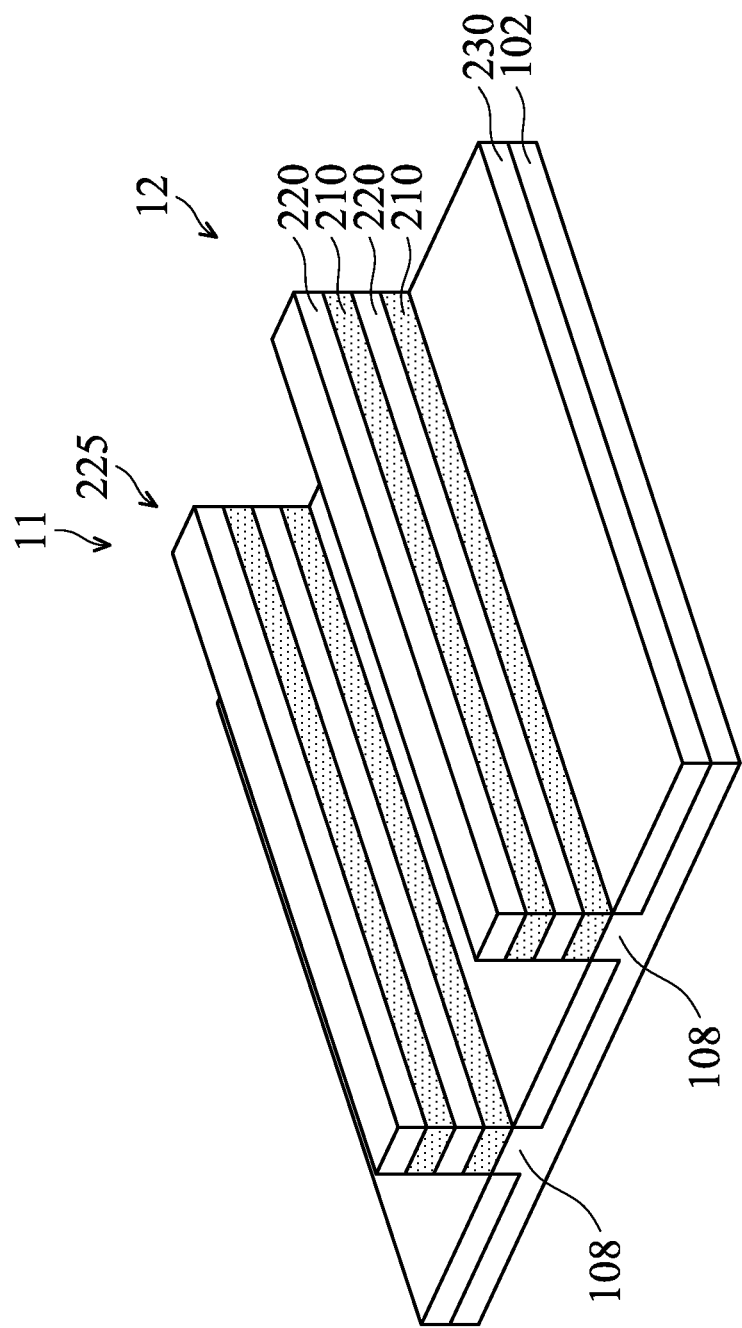

Afterwards, the insulating layer is thinned or planarized to expose the top surface of the second wire structure 220 as shown in FIG. 1C, in accordance with some embodiments. In some embodiments, the insulating layer is thinned firstly by a chemical mechanical polishing (CMP) process. Furthermore, the insulating layer is further recessed by an etching process to form an isolation structure 230, such as shallow trench isolation (STI) structure.

The fin structure 108 is extended above the substrate 102, and it is embedded in the isolation structure 230. In some embodiments, the top surface of the fin structure 108 is level with the top surface of the isolation structure 230. In other words, the bottom surface of the first wire structure 210 is level with the top surface of the isolation structure 230.

In some other embodiments, a buffer layer (not shown) is formed between the substrate 102 and fin structure 108. The buffer layer is configured to assist in forming the first semiconductor layer 110. A lattice constant of the buffer layer is between a lattice constant of the fin structure 108 and that of the substrate 102. The buffer layer may also called as a strain relaxed buffer (SRB) layer. In some embodiments, the buffer layer is made of silicon germanium (SiGe).

Figure 1D:
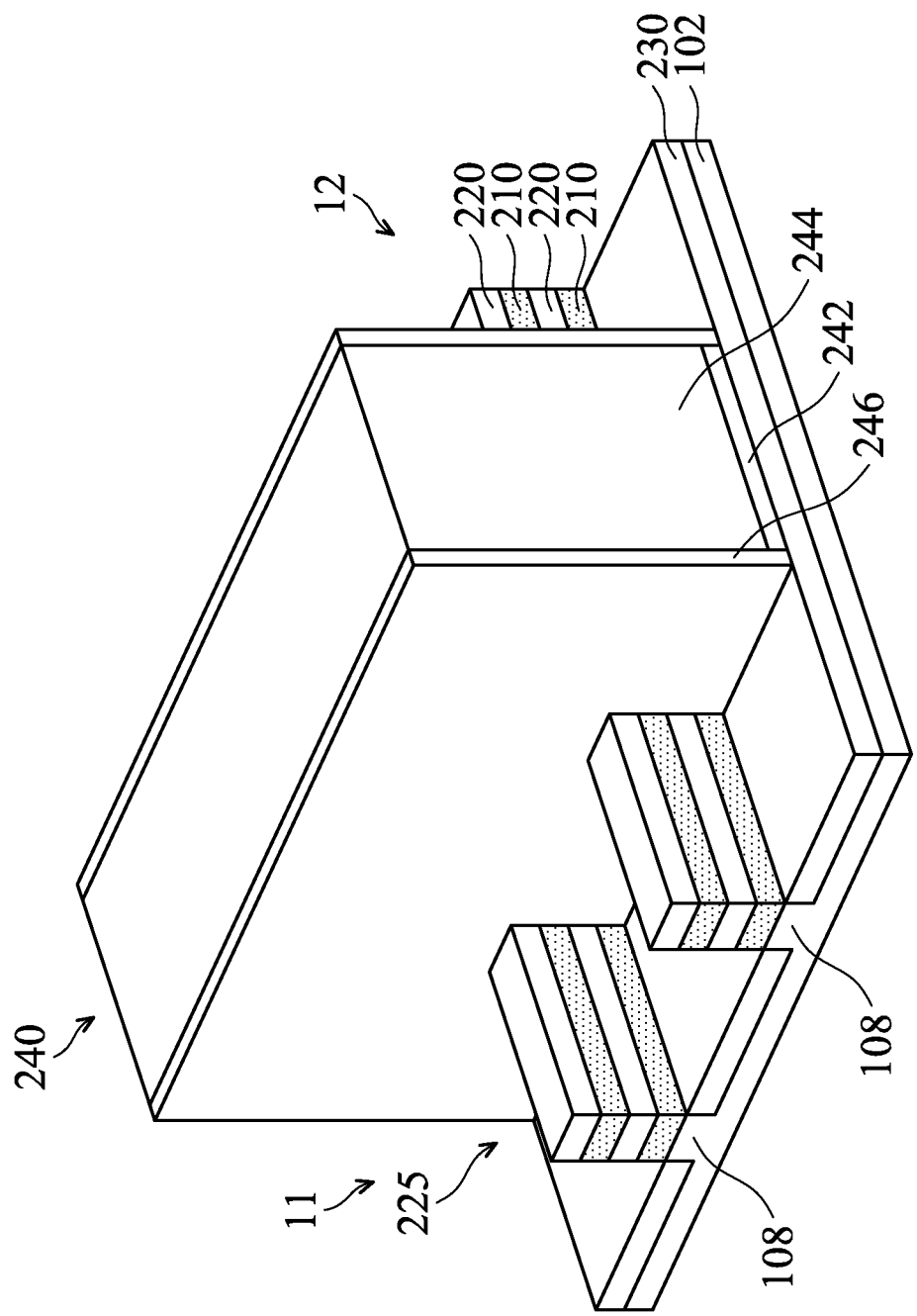

After the isolation structure 230 is formed, a dummy gate structure 240 is formed over a middle portion of the stacked wire structure 225 as shown in FIG. 1D, in accordance with some embodiments. More specifically, the dummy gate structure 240 is formed across the first wire structures 210 and the second wire structures 220.

The dummy gate structure 240 includes a dummy gate dielectric layer 242 and a dummy gate electrode layer 244. In some embodiments, the dummy gate dielectric layer 242 is made of dielectric layer, such as silicon oxide. In some embodiments, the dummy gate electrode layer 244 is made of polysilicon. The dummy gate electrode layer 244 may be replaced by another conductive material (such as metal material).

In some embodiments, the dummy gate structure 240 may be formed by a procedure including a deposition process, a photolithography process and an etching process. The deposition process may include a chemical vapor deposition (CVD) process, an atomic layer deposition (ALD) process, a physical vapor deposition (PVD) process, a spin-on process, or another applicable process. The photolithography process is described above. The etching process may be a dry etching process or a wet etching process.

The spacers 246 are formed on the opposite sidewalls of the dummy gate structure 240. The spacers 246 may be a single layer or multiple layers. The spacers 246 are made of dielectric materials. The dielectric materials may include silicon nitride, silicon oxide, silicon oxynitride, silicon carbide, or a combination thereof. In some embodiments, the spacers 246 are conformally deposited. In some embodiments, the spacers 246 are formed by a chemical vapor deposition (CVD) process, an atomic layer deposition (ALD) process, a physical vapor deposition (PVD) process, a spin-on process, or another applicable process.

Figure 1E:
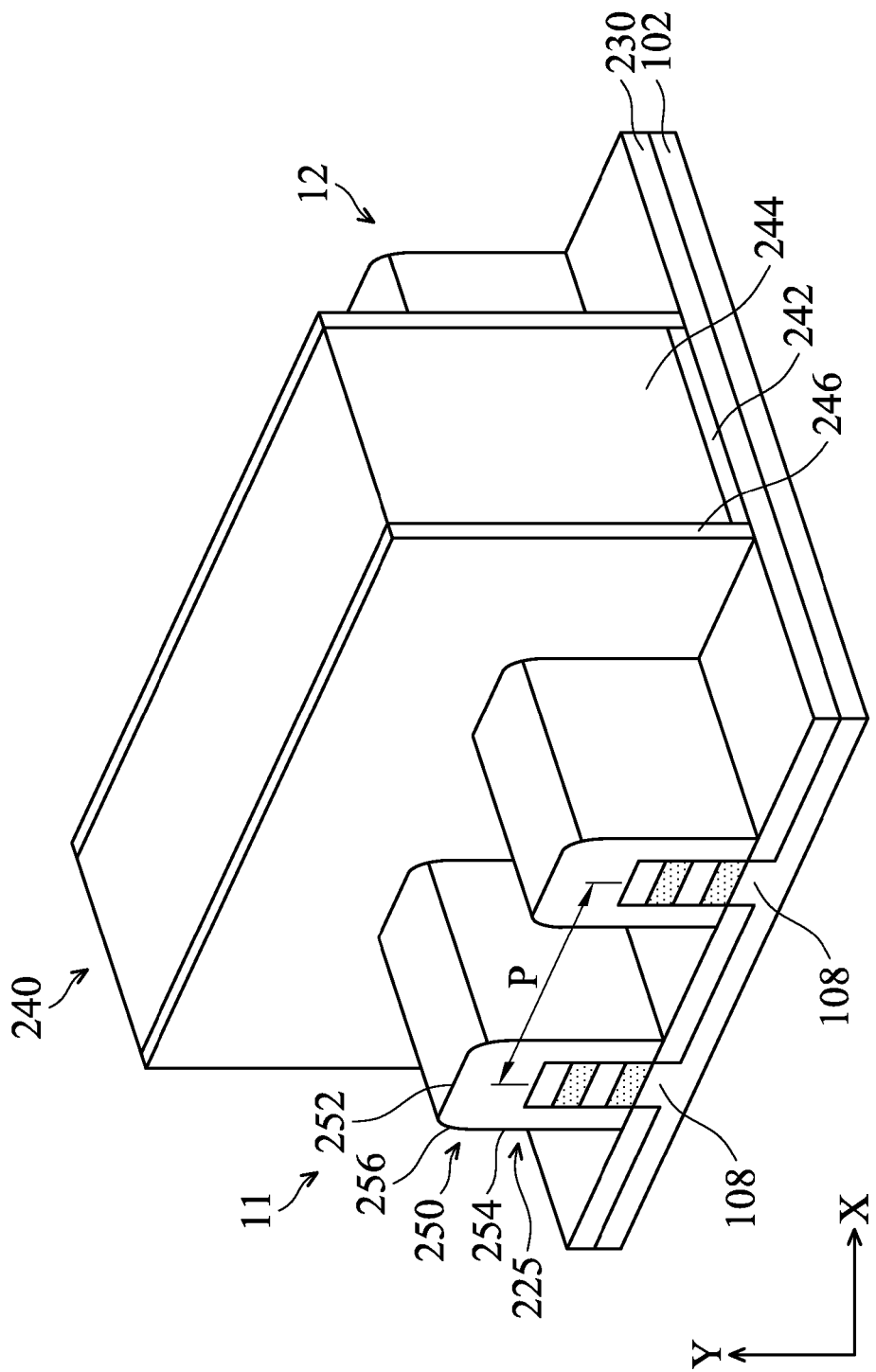

After the spacers 246 are formed, source/drain (S/D) structures 250 are formed, as shown in FIG. 1E, in accordance with some embodiments. The spacers 246 are formed between the dummy gate structure 240 and the S/D structures 250.

One S/D structure 250 is formed in the first region 11, and another S/D structure 250 is formed in the second region 12. The S/D structures 250 may also be used to provide stress or strain to the channel regions which is below the dummy gate structure 240. Therefore, the carrier mobility and the performance of the semiconductor device structure are improved.

The S/D structures 250 include a top surface 252, a sidewall surface 254, and a corner 256 between the top surface 252 and the sidewall surface 254. It should be noted that the corner 256 is rounded. In some embodiments, more than one corner 256 is rounded. Compared with a sharp corner, the rounded corners 256 may provide more surface area for contacting a contact structure (shown in FIG. 1L).

The S/D structures 250 are in direct contact with the stacked wire structure 225. More specifically, the S/D structures 250 are in direct contact with the first semiconductor wire 210 and the second semiconductor later 220.

The orientations of the first semiconductor wire 210 and the second semiconductor later 220 are dependent on the orientation of the substrate 102. In addition, the orientations of the S/D structures 250 are dependent on the orientation of the first semiconductor wire 210 and the second semiconductor later 220. The rounded corners 256 are formed due to the surface orientations of the substrate 102.

As mentioned above, the substrate is designed to have the (110) or (111) surface orientations. The (110) or (111) surface orientations of the substrate 102 is used to assist in formation of rectangular-like shape S/D structures 250. The S/D structures 250 may grow along a vertical direction (e.g. Y-axis) and a horizontal direction (e.g. X-axis) due to the (110) or (111) surface orientations of the substrate 102. In some embodiments, the S/D structures 250 is grown on the (111) plane in the horizontal direction (e.g. X-axis), and it is grown on the (110) plane in the vertical direction.

More specifically, when the substrate 102 has (110) surface orientation, the channel which is directly below the dummy gate structure 240 is along the <112> or <111> directions. Therefore, the sidewall of the S/D structures 250 is oriented along the <112> or <111> direction. For example, when the substrate 102 has (110) surface orientation, there are two embodiments. In the first embodiments, the channel is along the <112> direction, and the sidewall of the S/D structures 250 is grown along the <111> direction. In the second embodiments, the channel is along the <111> direction, and the sidewall of the S/D structures 250 is grown along the <112> direction.

For example, when the substrate 102 has (111) surface orientation, the channel is along the <100> direction, and the sidewall of the S/D structures 250 is grown along the <112> direction.

As shown in FIG. 1E, the growth rate of the S/D structures 250 along the vertical direction is greater than that of the S/D structures 250 along the horizontal direction. In some embodiments, a ratio of vertical growth rate to the horizontal growth rate is in a range from about 2 to about 5. When the ratio is within the above-mentioned range, rectangular-like S/D structures 250 with rounded corners are obtained.

A pitch P is between the fin structure 108 in the first region 11 and another fin structure 108 in the second region 12. In other words, the pitch P is between the one stacked wire structure 225 in the first region 11 and another stacked wire structure 225 in the second region 12. In some embodiments, the pitch P is in a range from about 10 nm to about 30 nm.

It should be noted that, as the size of the semiconductor device structure becomes smaller, the pitch P between two adjacent fin structures 108 become smaller. If two adjacent S/D structures both have diamond-like shapes, the adjacent S/D structures (one in first region 11, and another in the second region 12) may come into contact with each other. This may cause an undesirable short-circuiting problem, and the performance of the semiconductor device structure may decrease further. In contrast to the adjacent S/D structures both having diamond-like shapes, the adjacent S/D structures 250 both have rectangular-like shapes, and the risk of a short circuit is reduced. In addition, the S/D structures 250 provide more surface area to contact a contact structure (formed later, as shown in FIG. 1L). Therefore, the resistance of the contact structure may be decreased, and the performance of the semiconductor device structure may improve even further.

In some embodiments, the S/D structures 250 include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or a combination thereof. In some embodiments, the S/D structures 250 may doped with one or more dopants. In some embodiments, the S/D structures 250 are silicon (Si) doped with phosphorus (P), arsenic (As), antimony (Sb), or another applicable dopant. Alternatively, the S/D structures 250 are silicon germanium (SiGE) doped with boron (B) or another applicable dopant.

In some embodiments, the S/D structures 250 are formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, the S/D structures 250 are in-situ doped or undoped during the epi process. When the S/D structures 250 are undoped, they may be doped in a subsequent process. The doping may be achieved by an ion implantation process, plasma immersion ion implantation (PIII) process, gas and/or solid source diffusion process, or other suitable process. Afterwards, the S/D structures 250 may be exposed further to annealing processes, such as a rapid thermal annealing process.

Figure 1F:
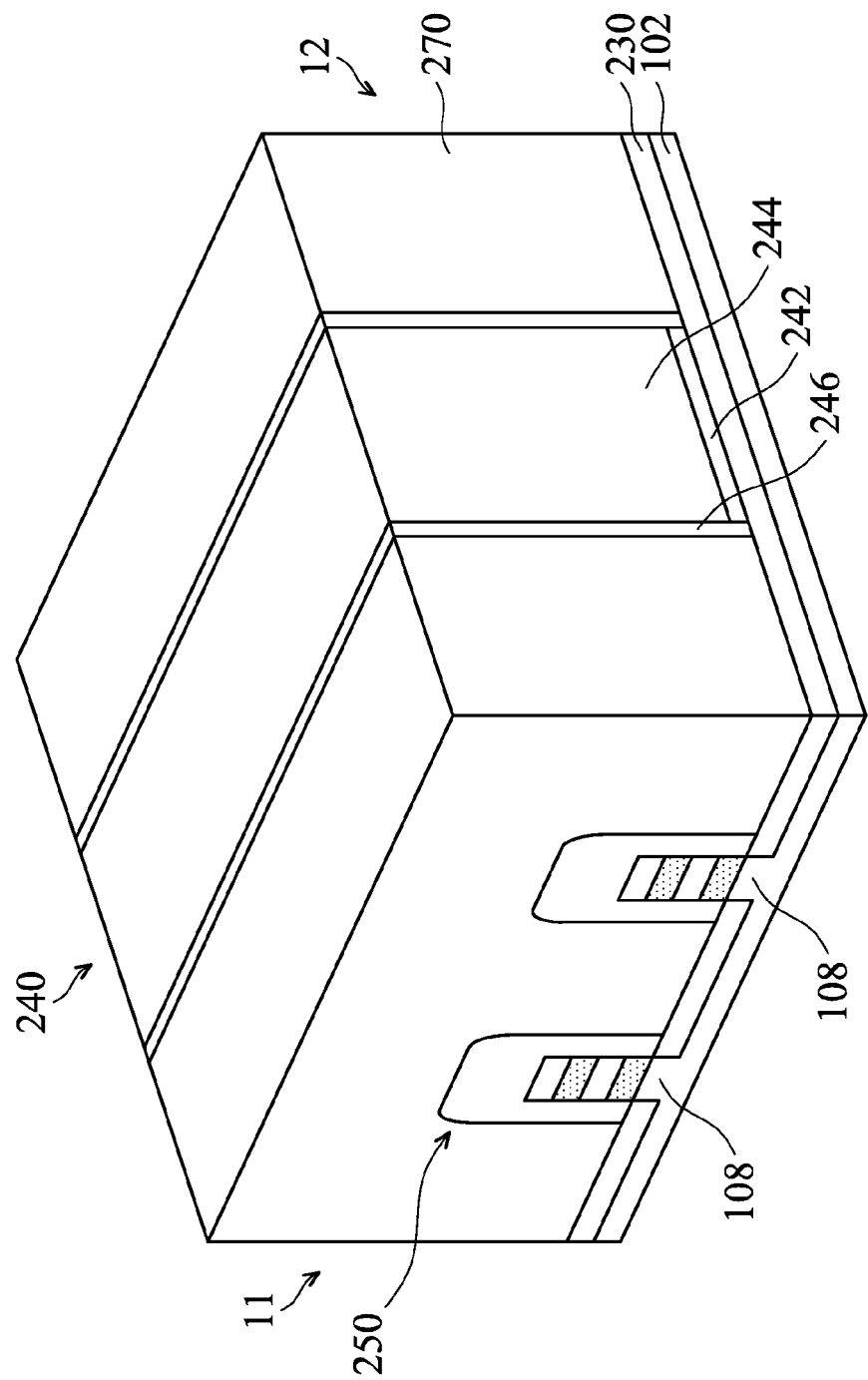

After the S/D structures 250 are formed, the inter-layer dielectric (ILD) layer 270 is formed over the S/D structures 250 and the substrate 102 as shown in FIG. 1F, in accordance with some embodiments. The ILD layer 270 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 270 may be formed by chemical vapor deposition (CVD), physical vapor deposition, (PVD), atomic layer deposition (ALD), spin-on coating, or other applicable processes.

Afterwards, a polishing process is performed to the ILD layer 270 until a top surface of the dummy gate structure 240 is exposed. In some embodiments, the ILD layer 270 is planarized by a chemical mechanical polishing (CMP) process.

In some other embodiments, a contact etch stop layer (CESL) (not shown) may be formed between the S/D structures 250 and the ILD layer 270. In some embodiments, the contact etch stop layer is made of silicon nitride, silicon oxynitride, and/or other applicable materials. The contact etch stop layer may be formed by plasma enhanced chemical vapor deposition (CVD) process, low pressure CVD process, atomic layer deposition (ALD) process, or other applicable processes.

Figure 1G:
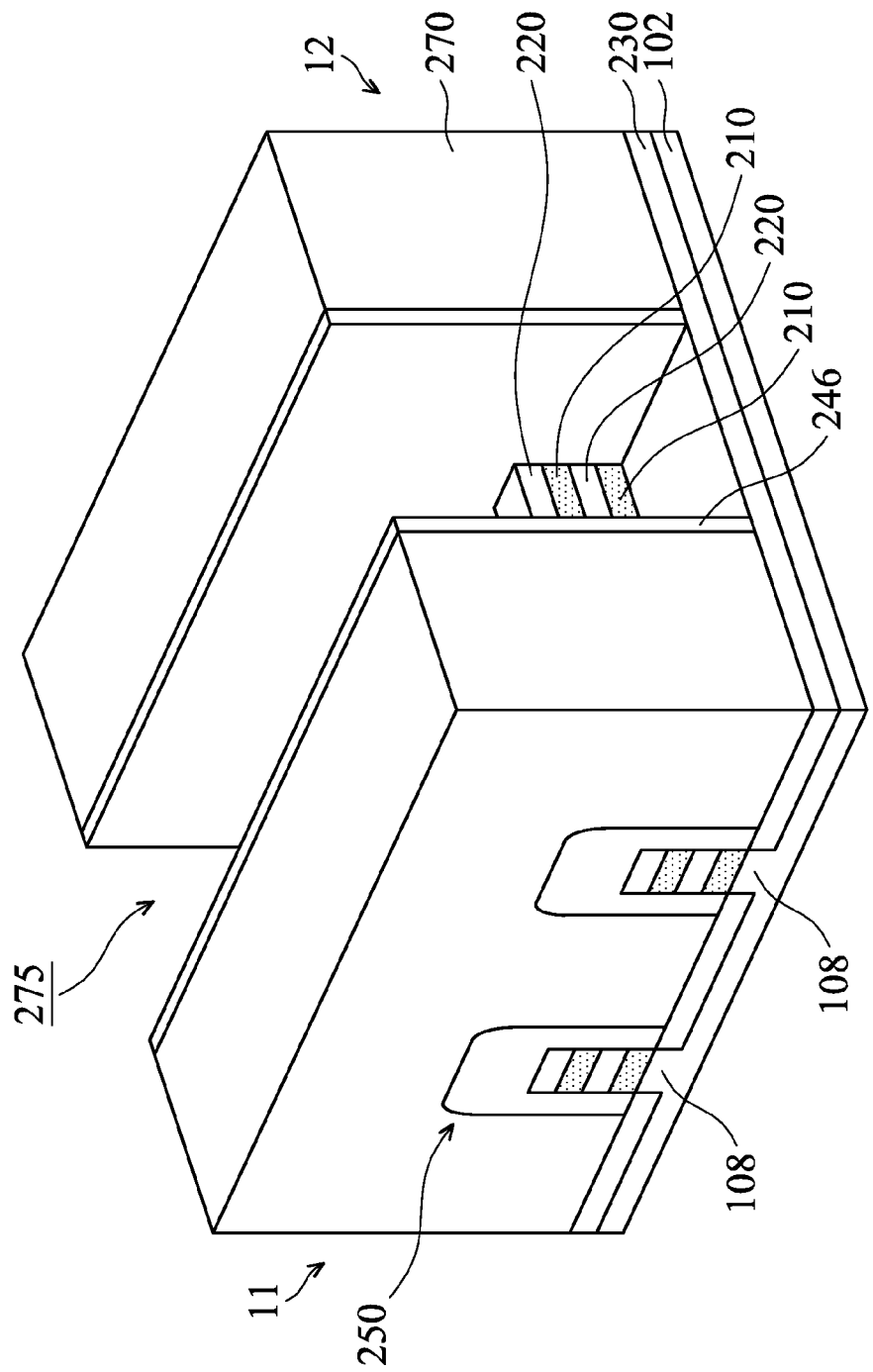

After the ILD layer 270 is formed, the dummy gate structure 240 is removed to form a trench 275 in the ILD layer 270, as shown in FIG. 1G, in accordance with some embodiments. As a result, the middle portions of the stacked wire structures 225 are exposed. More specifically, the first semiconductor wires 210 and the second semiconductor wires 220 are exposed. In addition, the first semiconductor wires 210 and the second semiconductor wires 220 are all connected to the S/D structures 250.

In some embodiments, the dummy gate electrode layer 244 is removed by a first etching process, and the dummy gate dielectric layer 242 is removed by a second etching process.

Figure 1H:
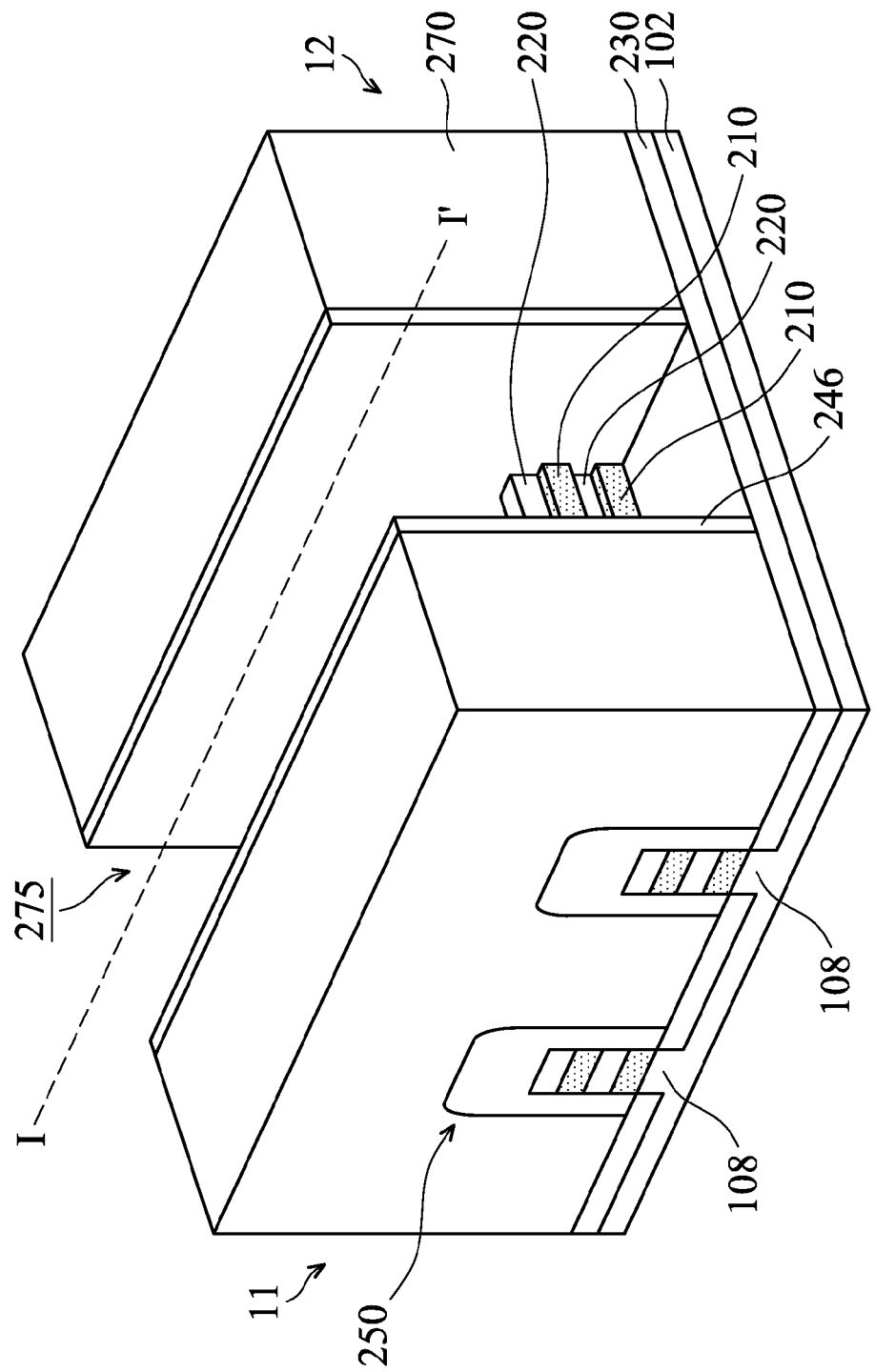
Figure 2A:
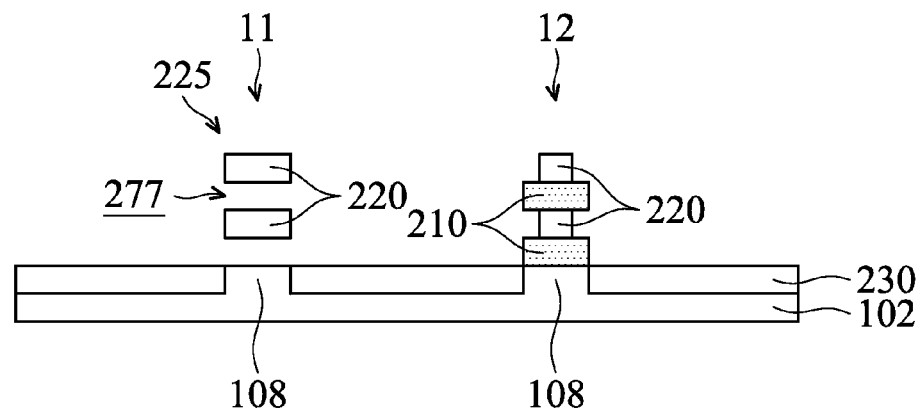
FIG. 2A shows a cross-sectional representation of the semiconductor device structure along line II' shown in FIG. 1H.

After the dummy gate structure 240 is removed, a portion of the second semiconductor wires 220 is removed, as shown in FIG. 1H, in accordance with some embodiments. FIG. 2A shows a cross-sectional representation of the semiconductor device structure along line II' shown in FIG. 1H.

Referring to FIG. 1H and FIG. 2A, in the first region 11, the exposed portions of the first semiconductor wires 210 are removed. As a result, the second semiconductor wires 220 suspend between the S/D structures 250. Recesses 277 are formed between the remaining second semiconductor wires 220. In the second region 12, the exposed portions of the second semiconductor wire 220 are partially removed.

More specially, since the second semiconductor wires 220 are attached to the S/D structures 250, the second semiconductor wires 220 are held in their original position by the S/D structures 250 even after the exposed portions of the first semiconductor wires 210 are removed.

In some embodiments, when the first semiconductor wires 210 are made of silicon (Si) and the second semiconductor wires 220 are made of silicon germanium (SiGe), an NMOS device structure is formed in the first region 11 and a PMOS device structure is formed in the second region 12.

In some other embodiments, when the first semiconductor wires 210 are made of silicon germanium (SiGe) and the second semiconductor wires 220 are made of germanium (Ge), an NMOS device structure is formed in the first region 11 and a PMOS device structure is formed in the second region 12.

Figure 1I:
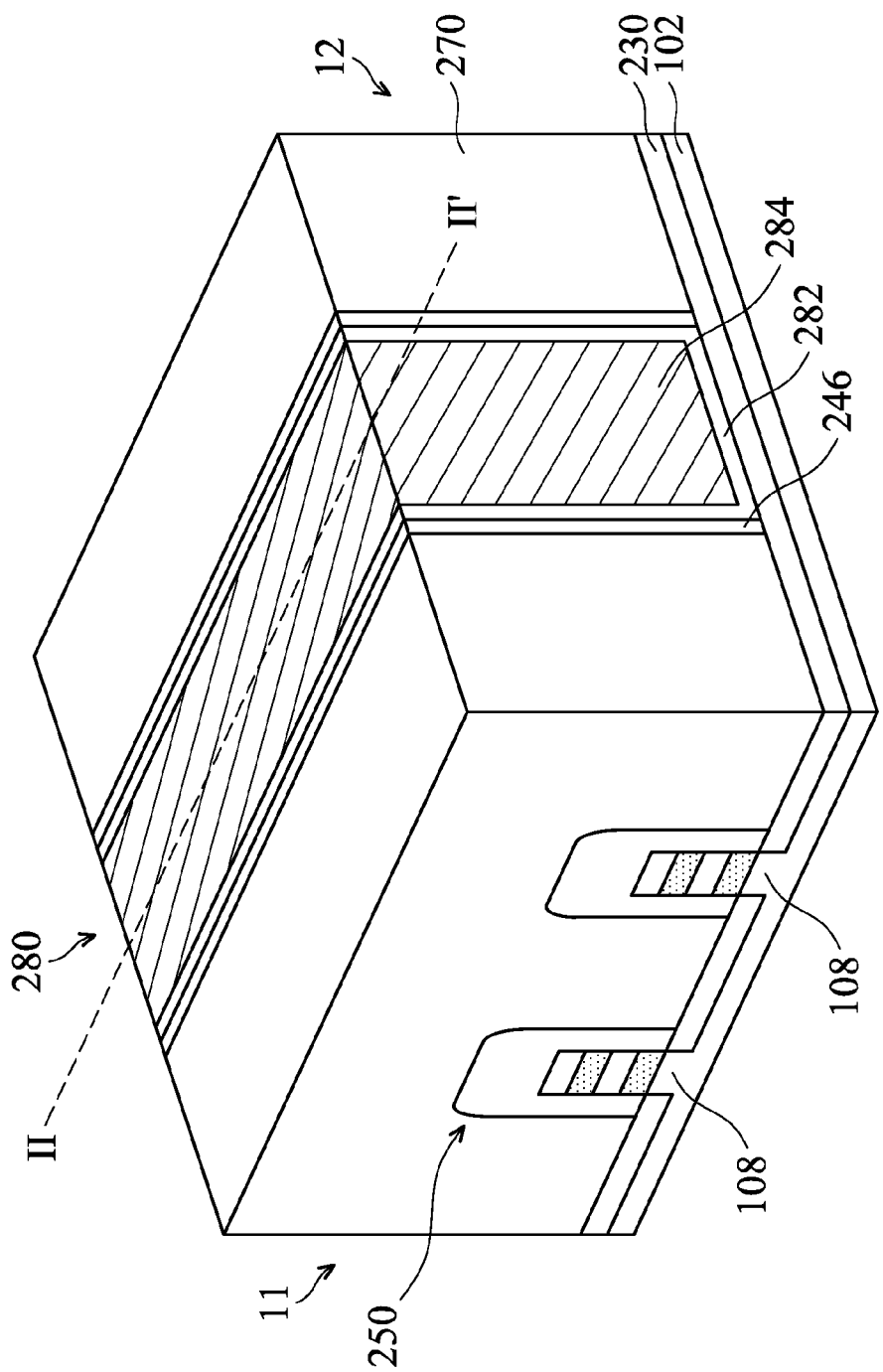
Figure 2B:
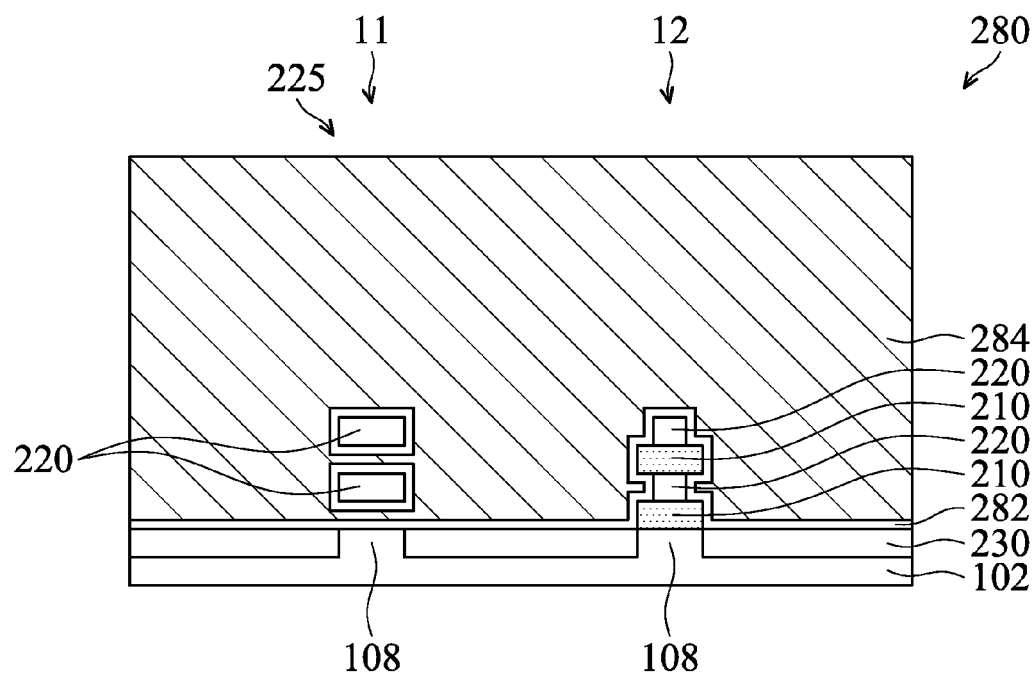
FIG. 2B shows a cross-sectional representation of the semiconductor device structure along line II' shown in FIG. 1I.

Afterwards, a metal gate structure 280 is formed in the trench 275 and the recesses 277, as shown in FIG. 1I, in accordance with some embodiments. FIG. 2B shows a cross-sectional representation of the semiconductor device structure along line II' shown in FIG. 1I.

The metal gate structure 280 includes a gate dielectric layer 282 and a gate electrode layer 284. As shown in FIG. 2B, in the first region 11, the two adjacent second semiconductor wires 220 are separated by the metal gate structure 280. In addition, the second semiconductor wires 220 are surrounded by the metal gate structure 280. The adjacent second semiconductor wires 220 are used as channel regions. In the second region 12, the remaining first semiconductor wires 210 and the second semiconductor wires 220 are surrounded by the metal gate structure 280.

In some embodiments, the gate dielectric layer 282 is made of a high-k dielectric material. The high-k dielectric material may include hafnium oxide, zirconium oxide, aluminum oxide, a hafnium dioxide-alumina alloy, hafnium silicon oxide, hafnium silicon oxynitride, hafnium tantalum oxide, hafnium titanium oxide, hafnium zirconium oxide, or the like.

In some embodiments, the gate electrode layer 284 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

Figure 3A:
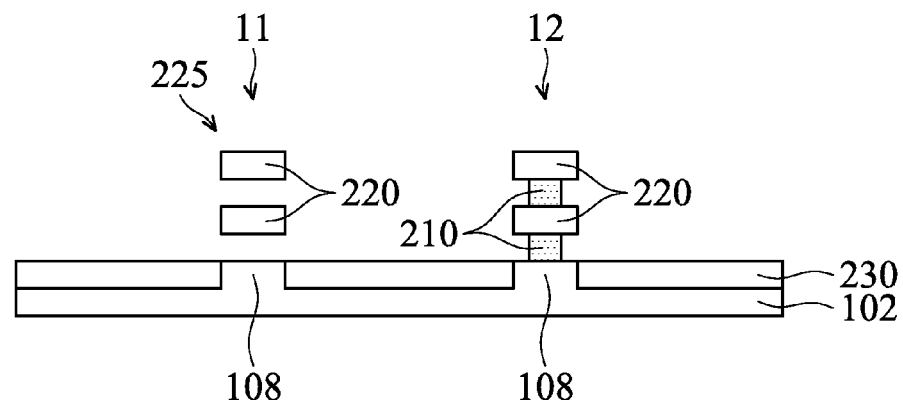
FIG. 3A shows a cross-sectional representation of modified embodiments of FIG. 2A.

FIG. 3A shows a cross-sectional representation of modified embodiments of FIG. 2A. In the first region 11, similar to FIG. 2A, the second semiconductor wires 220 suspend between the S/D structures 250. In the second region 12, in contrast to FIG. 2A, a portion of the first semiconductor wires 210 is partially removed, but the second semiconductor wires 220 remain.

Figure 3B:
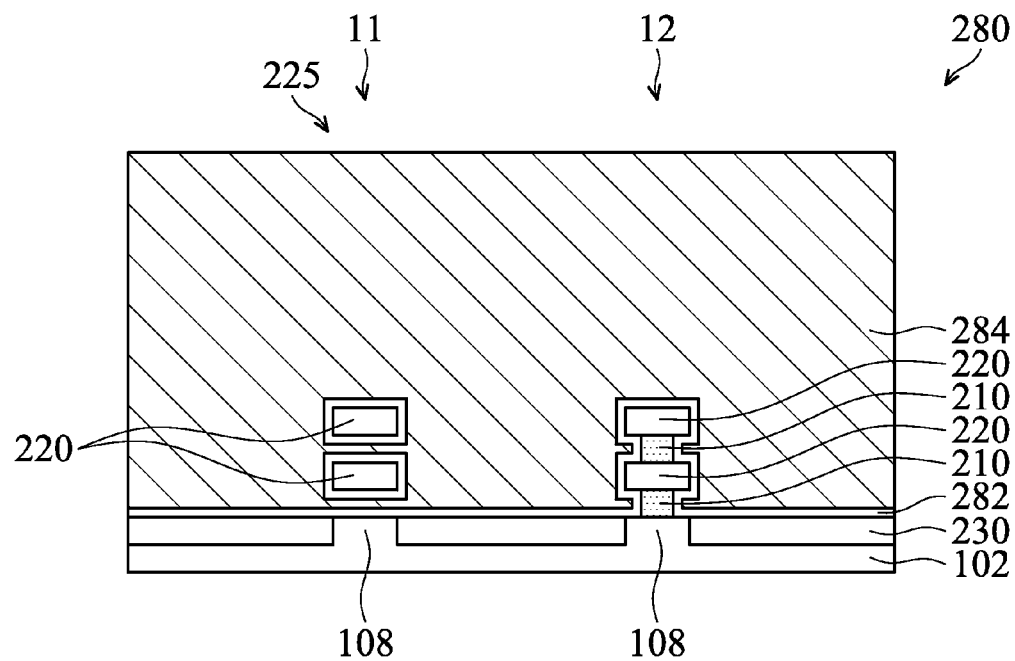
FIG. 3B shows a cross-sectional representation of modified embodiments of FIG. 2B.

FIG. 3B shows a cross-sectional representation of modified embodiments of FIG. 2B. The metal gate structure 280 including the gate dielectric layer 282 and the gate electrode layer 284 is formed over the first semiconductor wire 210 and the second semiconductor wire 220.

Figure 1J:
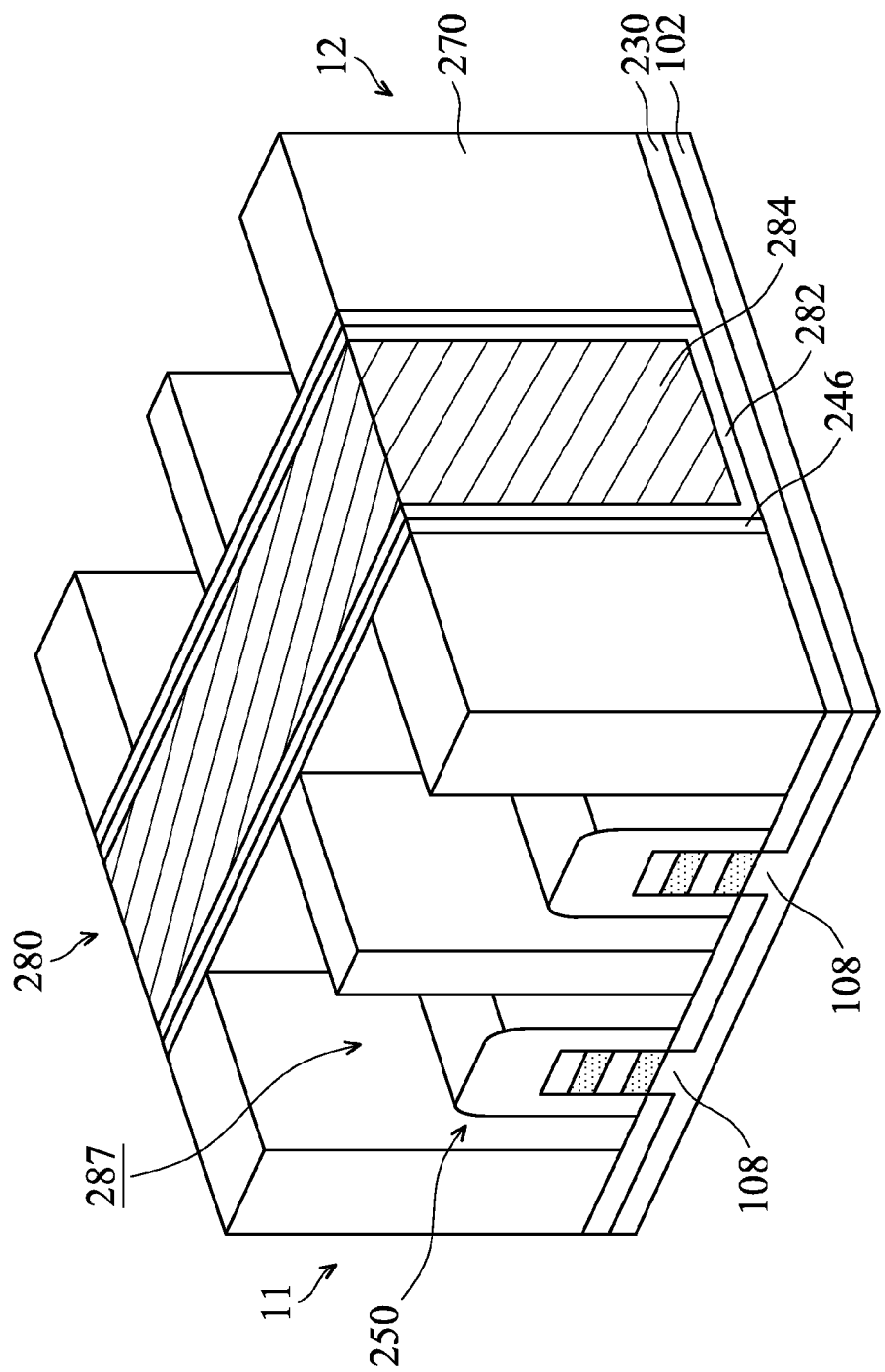

After the metal gate structure 280 is formed, a portion of the ILD layer 270 is removed to expose the S/D structures 250, as shown in FIG. 1J, in accordance with some embodiments. As a result, openings 287 are formed in the ILD layer 270. In addition, the top surface and sidewalls of the S/D structures 250 are exposed. A portion of the ILD layer 270 is remaining to separate the device in the first region 11 and another device in the second region 12.

Figure 1K:
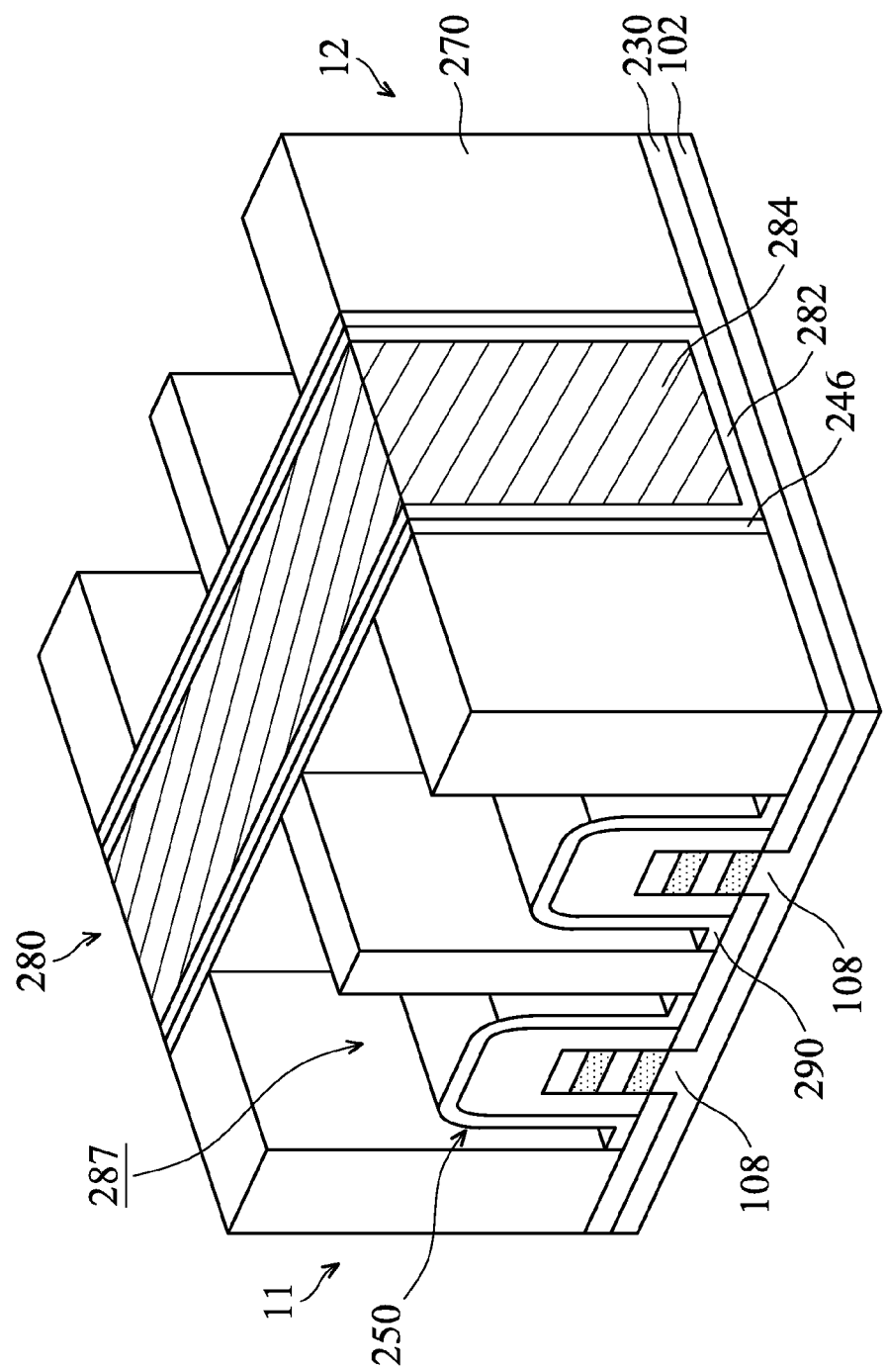
Figure 1L:
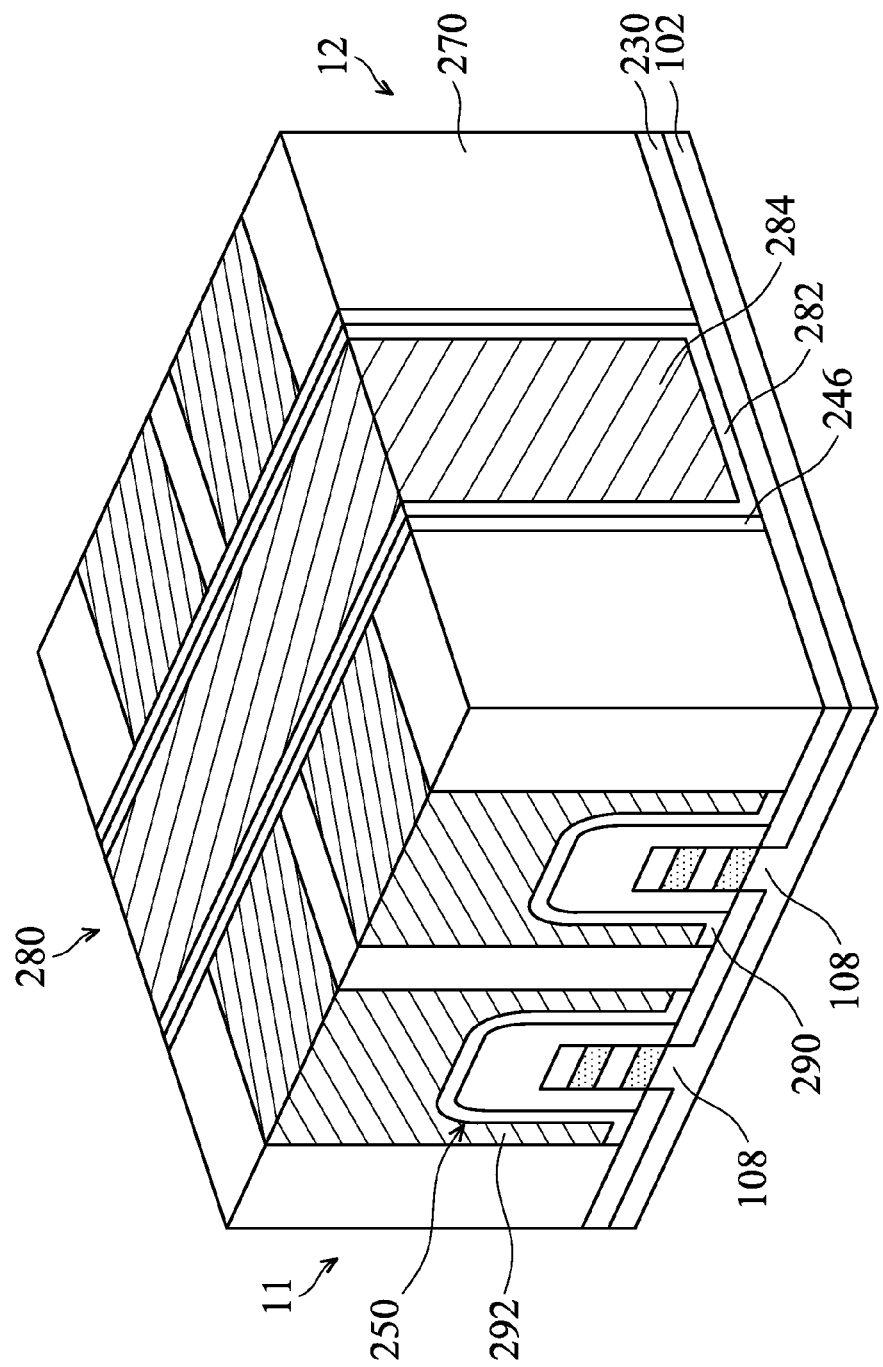

Afterwards, a silicide layer 290 is conformally formed over the S/D structures 250, as shown in FIG. 1K, in accordance with some embodiments. Since the S/D structures 250 have rounded corners, the silicide layer 290 which is conformally formed on the S/D structures 250 has rounded corners.

The formation of the silicide layer 290 includes forming a conformal conductive layer (not shown) in the openings 287. The conformal conductive layer is formed on the exposed S/D structures 250. In some embodiments, the conductive layer is made of metal material, such as titanium (Ti), nickel (Ni), cobalt (Co), or another applicable material. In some embodiments, the conductive layer is formed by an atomic layer deposition (ALD) process, or another applicable process. Next, an annealing process is performed.

Afterwards, the contact structure 292 is formed over the silicide layer 290, as shown in FIG. 1L, in accordance with some embodiments. A conductive material is filled with the openings 287, and a polishing process is performed to remove the excess portion of the conductive material which are out of the openings 287.

The S/D structures 250 are surrounded by the contact structure 292. As mentioned above, the S/D structures 250 having a rectangular-like shape provide more surface area for contact with the contact structure 292. Therefore, the resistance of the contact structure 292 may be decreased. Furthermore, the risk of a short circuit is reduced and the performance of the semiconductor device structure is improved.

Figure 4A:
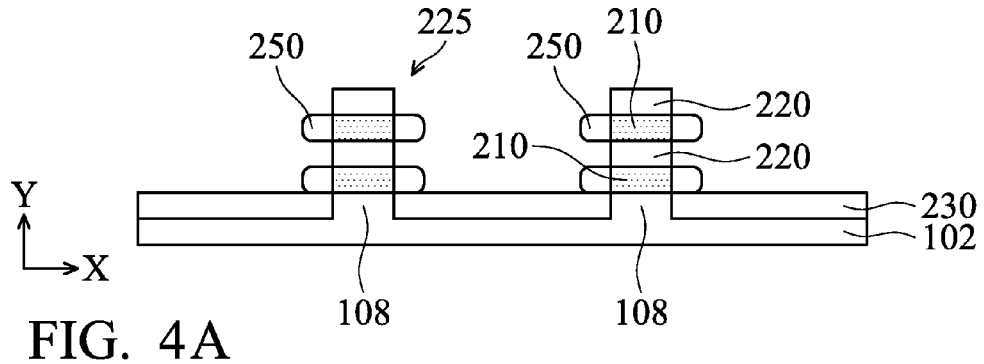
FIGS. 4A-4C show cross-sectional representations of various stages of forming S/D structures shown in FIG. 1E, in accordance with some embodiments of the disclosure.
Figure 4B:
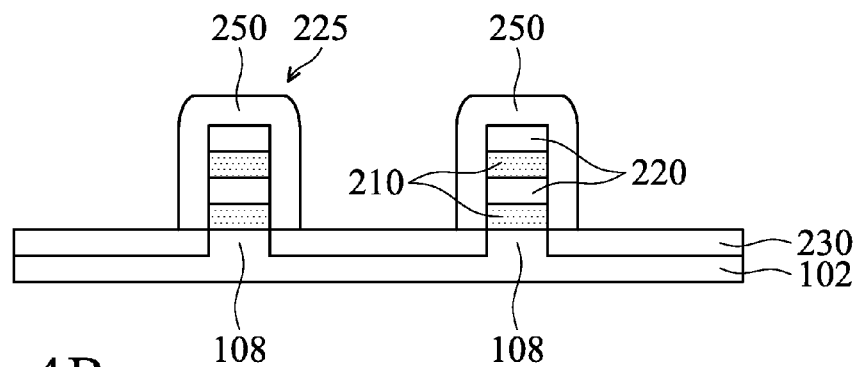
Figure 4C:
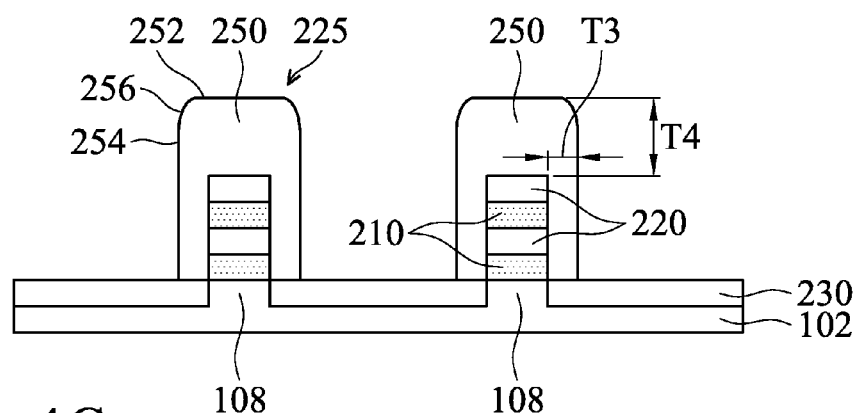

FIGS. 4A-4C show cross-sectional representations of various stages of forming S/D structures shown in FIG. 1E, in accordance with some embodiments of the disclosure. In this embodiment, the horizontal growth rate of the S/D structures 250 along the X-axis is smaller than the vertical growth rate of the S/D structures 250 along the Y-axis.

As shown in FIG. 4A, stacked wire structures 225 are formed over the substrate 102. Each of the stacked wire structures 225 includes two first semiconductor wires 210 and two second semiconductor wires 220. The S/D structures 250 are initially formed on the second semiconductor wires 220.

As shown in FIG. 4B, at the mediate stage, the S/D structures 250 are grown to cover all surfaces of the stacked wire structures 225.

As shown in FIG. 4C, at the final stage, the S/D structures 250 with the rectangular-like shape are formed over the stacked wire structures 225. In addition, each of the S/D structures 250 has a top surface 252, a sidewall surface 254, and a rounder corner 256 connected to the top surface 252 and the sidewall surface 254. The top surface 252 has a flat surface and is parallel to the top surface of the stacked wire structure 225.

As mentioned above, in some embodiments, as shown in FIG. 1E, the S/D structures 250 is grown on (111) plane in the horizontal direction (e.g. X-axis), and it is grown on (110) plane in the vertical direction. As a result, the vertical growth rate of the S/D structures 250 is greater than a horizontal growth rate.

As shown in FIG. 4C, the S/D structures 250 includes a sidewall portion and a top portion. The sidewall portion is over the sidewall of the stacked wire structure 225 and it has a third thickness $T_3$ along the horizontal direction (e.g. X-axis). The top portion is over the top surface of the stacked wire structure 225 and it has a fourth thickness $T_4$ along a vertical direction (e.g. Y-axis). The fourth thickness $T_4$ is greater than the third thickness $T_3$.

Figure 5A:
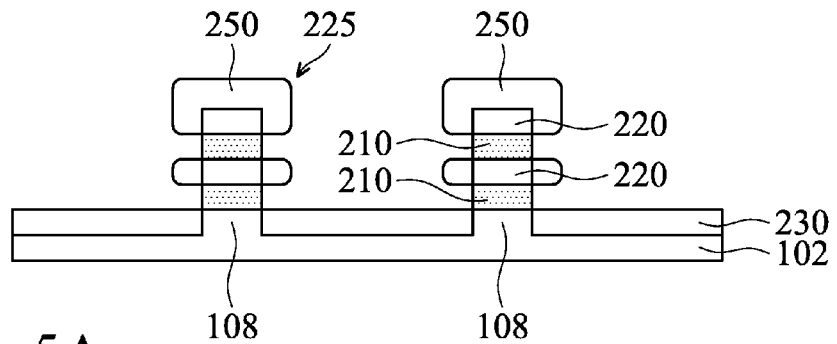
FIGS. 5A-5C show cross-sectional representations of various stages of forming S/D structures, in accordance with some embodiments of the disclosure.
Figure 5B:
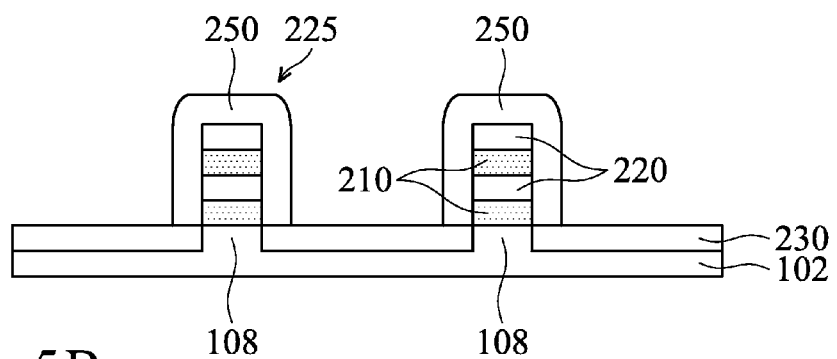
Figure 5C:
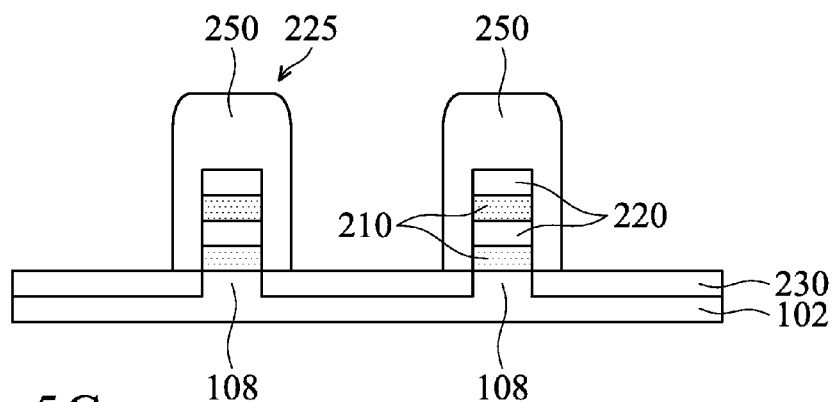

FIGS. 5A-5C show cross-sectional representations of various stages of forming S/D structures, in accordance with some embodiments of the disclosure.

As shown in FIG. 5A, stacked wire structures 225 are formed over the substrate 102. Compared with FIG. 4A, the S/D structures 250 are initially formed on the first semiconductor wires 210, rather than on the second semiconductor wires 220.

As shown in FIG. 5B, at the mediate stage, the S/D structures 250 are grown to cover all surfaces of the stacked wire structures 225.

As shown in FIG. 5C, at the final stage, the S/D structures 250 is grown on the (111) plane in the horizontal direction (e.g. X-axis), and it is grown on the (110) plane in the vertical direction. As a result, the vertical growth rate of the S/D structures 250 is greater than a horizontal growth rate of the S/D structures 250. Therefore, the S/D structures 250 with the rectangular-like shape are formed over the stacked wire structures 225.

Figure 6A:
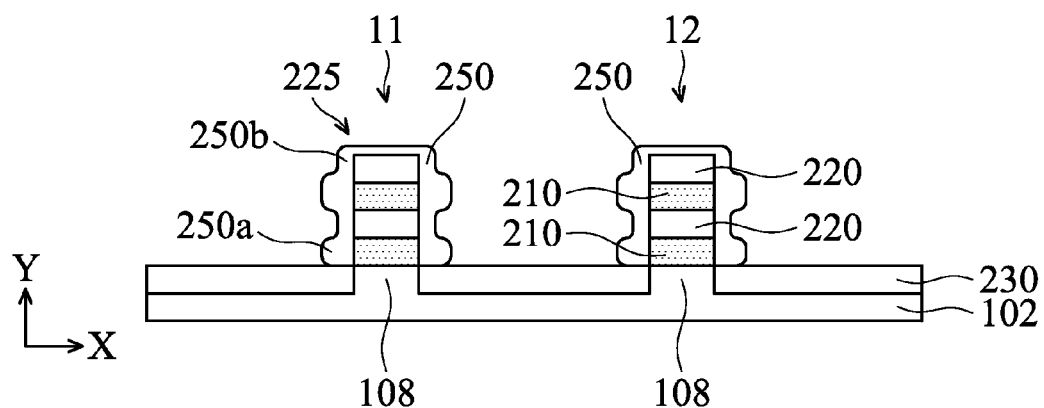
FIGS. 6A-6B show cross-sectional representations of various stages of forming S/D structures, in accordance with some embodiments of the disclosure.
Figure 6B:
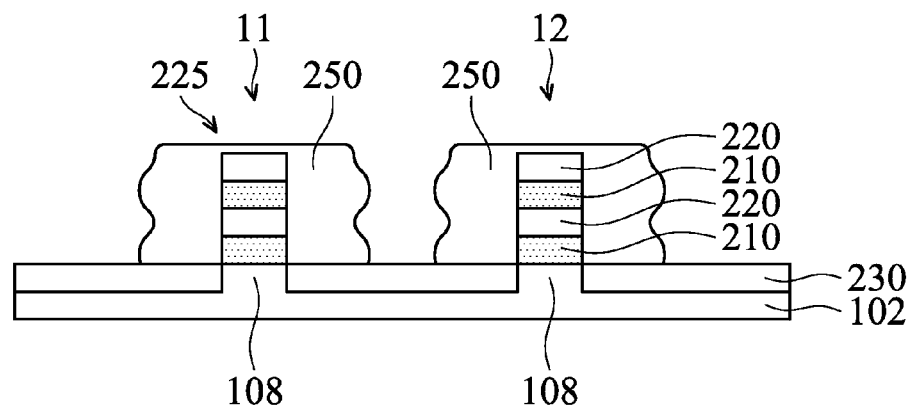

FIGS. 6A-6B show cross-sectional representations of various stages of forming S/D structures, in accordance with some embodiments of the disclosure. In this embodiment, the horizontal growth rate of the S/D structures 250 along the X-axis is greater than the vertical growth rate of the S/D structures 250 along the Y-axis. In some embodiments, a ratio of horizontal growth rate to the vertical growth rate is in a range from about 2 to about 5.

When the ratio is within the above-mentioned range, the rectangular-like S/D structures 250 with rounded corners are obtained. In some embodiments, the S/D structures 250 is grown on the (110) plane in the horizontal direction (e.g. X-axis), and it is grown on the (111) plane in the vertical direction.

As shown in FIG. 6A, the S/D structures 250 includes a first portion 250a over sidewalls of the first semiconductor wire 210 and a second portion 250b over sidewalls of the second semiconductor wire 220. The first portion 250a is thicker than the second portion 250b.

As shown in FIG. 6B, in the final stage, the sidewalls of the S/D structures 250 have periodical wave-like profile. The roughened surface of the sidewalls of the S/D structures 250 provide more surface area for contacting the contact structure 292 (as shown in FIG. 1L). Therefore, the resistance of the contact structure 292 may be decreased. Since the horizontal growth rate is greater than the vertical growth rate, the thickness of the first portion 250a or the second portion 250b is thicker than that of the top portion of the S/D structure 250 over the top surface of the second semiconductor wire 220.

In some embodiments, when substrate 102 has (110) surface orientation, the channel is along the <100> direction, and the sidewalls of the S/D structure 250 is grown along the <110> direction. In some other embodiments, when substrate 102 has (111) surface orientation, the channel is along the <112> direction, and the sidewalls of the S/D structure 250 is grown along the <110> direction.

Figure 7A:
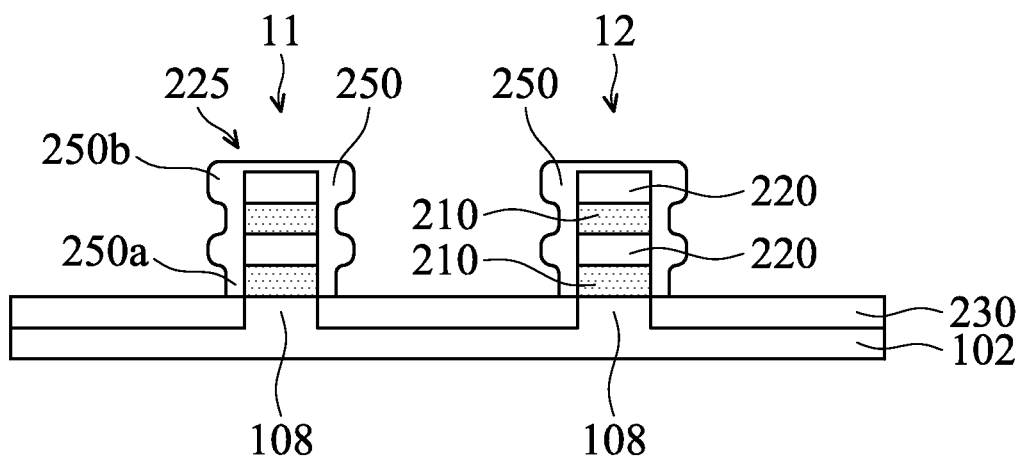
FIGS. 7A-7B show cross-sectional representations of various stages of forming S/D structures, in accordance with some embodiments of the disclosure.
Figure 7B:
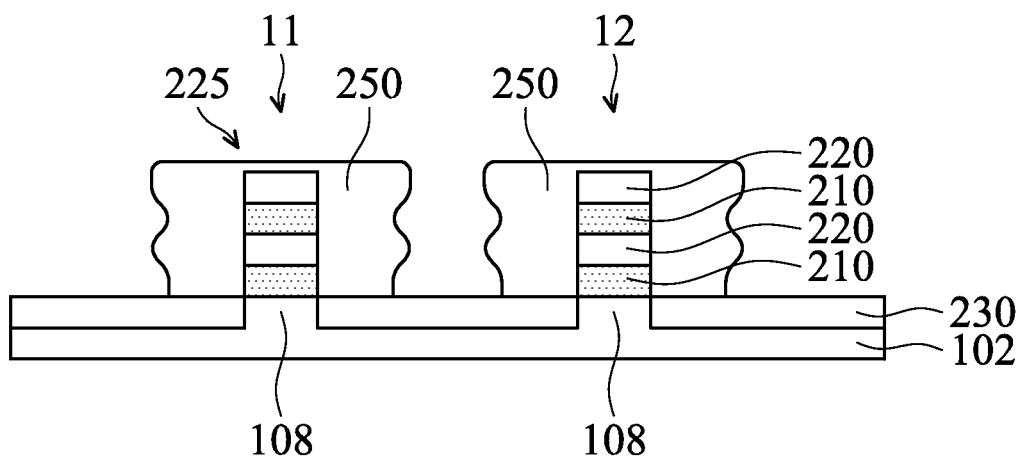

FIGS. 7A-7B show cross-sectional representations of various stages of forming S/D structures, in accordance with some embodiments of the disclosure.

As shown in FIG. 7A, in contrast to FIG. 6A, the first portion 250a is thinner than the second portion 250b.

As shown in FIG. 7B, in the final stage, the sidewalls of the S/D structures 250 have periodical wave-like profile.

As mentioned above, Table 1 shows a relationship of orientation of the channel and the orientation of the sidewall of the S/D structures 140.

| Substrate orientation | Orientation of the Channel | Orientation of the sidewalls of S/D structure | Profile of the S/D structure |
| --- | --- | --- | --- |
| (110) | <111> | <112> | FIG. 4C or 5C |
|  | <100> | <110> | FIG. 6 or 7 |
|  | <112> | <111> | FIG. 4C or 5C |
| (111) | <112> | <110> | FIG. 6 or 7 |
|  | <100> | <112> | FIG. 4C or 5C |

As shown in Table 1, the profiles of the S/D structures 250 are influenced by the orientations of the first semiconductor wires 210 and the second semiconductor wires 220. The orientation of the first semiconductor wires 210 and the second semiconductor wires 220 are influenced by the orientation of the substrate 102. A rectangular-like shape of the S/D structures 250 is obtained by controlling the orientation of the substrate 102.

Embodiments for forming a semiconductor device structure and method for formation the same are provided. A stacked wire structure is formed over a substrate with (110) or (111) surface orientation. A gate structure is formed over a middle portion of the stacked wire structure. The S/D structures are formed at two opposite sides of the stacked wire structure. The S/D structure has a rectangular-like shape. In addition, two adjacent S/D structures are discrete. The shape of the S/D structure is influenced by the arrangement or orientation of the substrate. By forming the rectangular-like shape, the S/D structure provides more surface area to contact a contact structure which is formed over the S/D structure. Therefore, the performance of the semiconductor device structure is improved.

In some embodiments, a semiconductor device structure is provided. The semiconductor device structure includes a substrate and a stacked wire structure formed over the substrate. The semiconductor device structure also includes a gate structure formed over a middle portion of the stacked wire structure and a source/drain (S/D) structure formed at two opposite sides of the stacked wire structure. The S/D structure comprises a top surface, a sidewall surface, and a rounded corner between the top surface and the sidewall surface.

In some embodiments, a semiconductor device structure is provided. The semiconductor device structure includes a substrate with (110) surface orientation or (111) surface orientation and a fin structure extending above the substrate. The semiconductor device structure also includes a first semiconductor wire formed over the fin structure and a second semiconductor wire formed over the first semiconductor wire. The first semiconductor wire and the second semiconductor wire are made of different materials. The semiconductor device structure also includes a gate structure formed over middle portions of the first semiconductor wire and the second semiconductor wire and a source/drain (S/D) structure formed at two opposite sides of the first semiconductor wire and the second semiconductor wire. The S/D structure includes a first portion over sidewalls of the first semiconductor wire and a second portion over sidewalls of the second semiconductor wire, and the first portion is thicker than, or thinner than, the second portion.

In some embodiments, a method for forming a semiconductor device structure is provided. The method includes forming a stacked wire structure over a substrate. The stacked wire structure includes a first semiconductor wire and a second semiconductor wire over the first semiconductor wire. The method also includes forming a dummy gate structure across middle portions of the stacked wire structure. The method further includes forming a source/drain (S/D) structure at two opposite sides of the stacked wire structure. The S/D structure is formed by an epitaxial process and it comprises a top surface, a sidewall surface, and a rounded corner between the top surface and the sidewall surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a stacked wire structure formed over the substrate, wherein the stacked wire structure comprises a second semiconductor wire over a first semiconductor wire, and the first semiconductor wire and the second semiconductor wire are made of different materials;
   a gate structure formed over a middle portion of the stacked wire structure; and
   a source/drain (S/D) structure formed at two opposite sides of the stacked wire structure, wherein the S/D structure comprises a top surface, a sidewall surface, and a rounded corner between the top surface and the sidewall surface.

2. The semiconductor device structure as claimed in claim 1, wherein the substrate has (110) surface orientation or (111) surface orientation.

3. The semiconductor device structure as claimed in claim 1, further comprising:
   a spacer formed between the gate structure and the S/D structure.

4. The semiconductor device structure as claimed in claim 1, wherein the S/D structure comprises a sidewall portion over sidewalls of the stacked wire structure and a top portion over the top surface of the stacked wire structure, wherein the sidewall portion has a first thickness along a horizontal direction, a top portion has a second thickness along a vertical direction, and the second thickness is greater than the first thickness.

5. The semiconductor device structure as claimed in claim 1, wherein the S/D structure comprises a first portion over sidewalls of the first semiconductor wire and a second portion over sidewalls of the second semiconductor wire, and the first portion is thicker than, or thinner than, the second portion.

6. The semiconductor device structure as claimed in claim 5, wherein the first portion and the second portion of the S/D structure have a periodical wave-like profile.

7. The semiconductor device structure as claimed in claim 5, wherein the first portion and the second portion of the S/D structure are oriented along <112>, <111> or <100> direction.

8. The semiconductor device structure as claimed in claim 1, further comprising:
   an isolation structure formed over the substrate, wherein a bottom surface of the stacked wire structure is level with a top surface of the isolation structure.

9. The semiconductor device structure as claimed in claim 8, further comprising:
   a fin structure extending above the substrate, wherein the fin structure is embedded in the isolation structure.

10. The semiconductor device structure as claimed in claim 1, further comprising:
    a silicide layer formed over the S/D structure; and
    a contact structure formed over the silicide layer.

11. The semiconductor device structure as claimed in claim 1, wherein a channel region is formed in the stacked wire structure and is covered by the gate structure, and the channel region is oriented along <112>, <111> or <100> direction.

12. A semiconductor device structure, comprising:
    a substrate with (110) surface orientation or (111) surface orientation;
    a fin structure extending above the substrate;
    a first semiconductor wire formed over the fin structure;
    a second semiconductor wire formed over the first semiconductor wire, wherein the first semiconductor wire and the second semiconductor wire are made of different materials;
    a gate structure formed over middle portions of the first semiconductor wire and the second semiconductor wire; and
    a source/drain (S/D) structure formed at two opposite sides of the first semiconductor wire and the second semiconductor wire, wherein the S/D structure comprises a first portion over sidewalls of the first semiconductor wire and a second portion over sidewalls of the second semiconductor wire, and the first portion is thicker than, or thinner than, the second portion.

13. The semiconductor device structure as claimed in claim 12, wherein the S/D structure comprises silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or a combination thereof.

14. The semiconductor device structure as claimed in claim 12, further comprising:
a buffer layer formed between the fin structure and the substrate, wherein a lattice constant of the buffer layer is between a lattice constant of the fin structure and a lattice constant of the substrate.

15. The semiconductor device structure as claimed in claim 12, further comprising:
a spacer formed between the gate structure and the S/D structure.

16. A semiconductor device structure, comprising:
a substrate with (110) surface orientation or (111) surface orientation;
a fin structure extending above the substrate, and having a stacked wire structure with a bottom surface;
an isolation structure formed over the substrate; and
a source/drain (S/D) structure formed at two opposite sides of the stacked wire structure, wherein the S/D structure comprises a top flat surface, a sidewall surface, and a rounded corner between the top flat surface and the sidewall surface;
wherein the stacked wire structure comprises a second semiconductor wire over a first semiconductor wire, the S/D structure comprises a first portion over sidewalls of the first semiconductor wire and a second portion over sidewalls of the second semiconductor wire, and the first portion and the second portion of the S/D structure have a periodical wave-like profile.

17. The semiconductor device structure as claimed in claim 16, wherein the S/D structure comprises a sidewall portion over sidewalls of the stacked wire structure and a top portion over a top surface of the stacked wire structure, wherein the sidewall portion has a first thickness along a horizontal direction, the top portion has a second thickness along a vertical direction, and the second thickness is greater than the first thickness.

18. The semiconductor device structure as claimed in claim 16, wherein the first portion and the second portion of the S/D structure are oriented along <112>, <111>, or <100> direction.

* * * * *